(12) United States Patent
Jang et al.

(10) Patent No.: US 7,362,035 B2
(45) Date of Patent: Apr. 22, 2008

(54) POLYMER BULK ACOUSTIC RESONATOR

(75) Inventors: Sei-Joo Jang, Seoul (KR); Qiming Zang, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 0 days.

(21) Appl. No.: 11/381,551

(22) Filed: May 4, 2006

(65) Prior Publication Data

US 2007/0063793 A1 Mar. 22, 2007

Related U.S. Application Data

(63) Continuation-in-part of application No. 11/162,775, filed on Sep. 22, 2005.

(51) Int. Cl.
*H03H 9/02* (2006.01)

(52) U.S. Cl. ....................... 310/320; 310/800

(58) Field of Classification Search ............... 310/320, 310/800
See application file for complete search history.

(56) References Cited

U.S. PATENT DOCUMENTS

| 5,160,870 A * | 11/1992 | Carson et al. ............... 310/339 |
| 6,182,619 B1 * | 2/2001 | Spitzer et al. ............ 123/51 B |
| 6,839,946 B2 * | 1/2005 | Ylilammi et al. .......... 29/25.35 |
| 2001/0017504 A1 * | 8/2001 | Aigner et al. ................ 310/330 |
| 2006/0164186 A1 * | 7/2006 | Stoemmer et al. .......... 333/189 |
| 2006/0202779 A1 * | 9/2006 | Fazzio et al. ................ 333/187 |

FOREIGN PATENT DOCUMENTS

WO WO/98/16957 * 4/1998

* cited by examiner

*Primary Examiner*—Thomas M. Dougherty
(74) *Attorney, Agent, or Firm*—John J. Elnitski, Jr.

(57) ABSTRACT

A polymer bulk acoustic resonator that includes an active semiconductor layer, a first thin film electrode layer applied to the semiconductor layer, a thin film electro-active polymer layer applied to the first thin film electrode layer; and a second thin film electrode layer applied to the thin film electro-active polymer layer.

12 Claims, 9 Drawing Sheets

POLYMER BULK ACOUSTIC RESONATOR

BACKGROUND

The dielectric filter and Surface Acoustic Wave (SAW) filter are used in current wireless mobile telecommunication networks, including phones typically referred to as cell phones. Recently, a new filter system of film bulk acoustic resonator has been introduced. A thin film of piezoelectric material of ZnO is deposited on a substrate of semiconductor made of Si material, by using sputtering methods and Magnetron Sputtering Equipment. The sputtering methods require the use of a Magnetron and are a relatively expensive technique. Also, in order to make an improve efficiency of energy coupling using a film bulk acoustic resonator, a Bragg Reflector is necessary between the ZnO layer and Si Substrate. The Bragg Reflector is usually made by depositing about seven to eight layers alternatively of a very heavy material such as Tungsten with the not so heavy layers of SiO2. This is necessary to prevent acoustic energy resonating loss from inside the piezoelectric thin film of ZnO. The acoustic energy resonating dissipates or leaks out because the magnitudes of two acoustic impedances of ZnO and Si are similar in order. Tungsten has an acoustic impedance of $10.1 \times 10(7)$ Kg/m(2)s or 101 Mrayls. SiO2 has an acoustic impedance of $1.31 \times 10(7)$ Kg/m(2)s, which is about $\frac{1}{10}$ of that of Tungsten. The mismatch between two acoustic impedances of Tungsten and SiO2 in the Bragg Reflector isolates acoustically the active piezoelectric ZnO layer from the Si substrate. All depositions of layers for the film bulk acoustic resonator are done by using the Magnetron. The film bulk acoustic resonator has potential to be co-processed with active materials of semi-conductors such as Si or SiGe or GaAs. But, the use of film bulk acoustic resonator has a few difficulties to overcome and can be a quite expensive process to manufacture. Also, resonant frequency is function of the thickness of ZnO in a film bulk acoustic resonator, therefore, uniformity of the ZnO thin film thickness is very important. It takes great care and expense to obtain a uniform thin film of ZnO in the order $\frac{1}{10}$ of 1 um.

SUMMARY OF THE INVENTION

A polymer bulk acoustic resonator that includes an active semiconductor layer, a first thin film electrode layer applied to the semiconductor layer, a thin film electro-active polymer layer applied to the first thin film electrode layer; and a second thin film electrode layer applied to the thin film electro-active polymer layer.

DETAILED DESCRIPTION OF THE INVENTION

Figure 1:
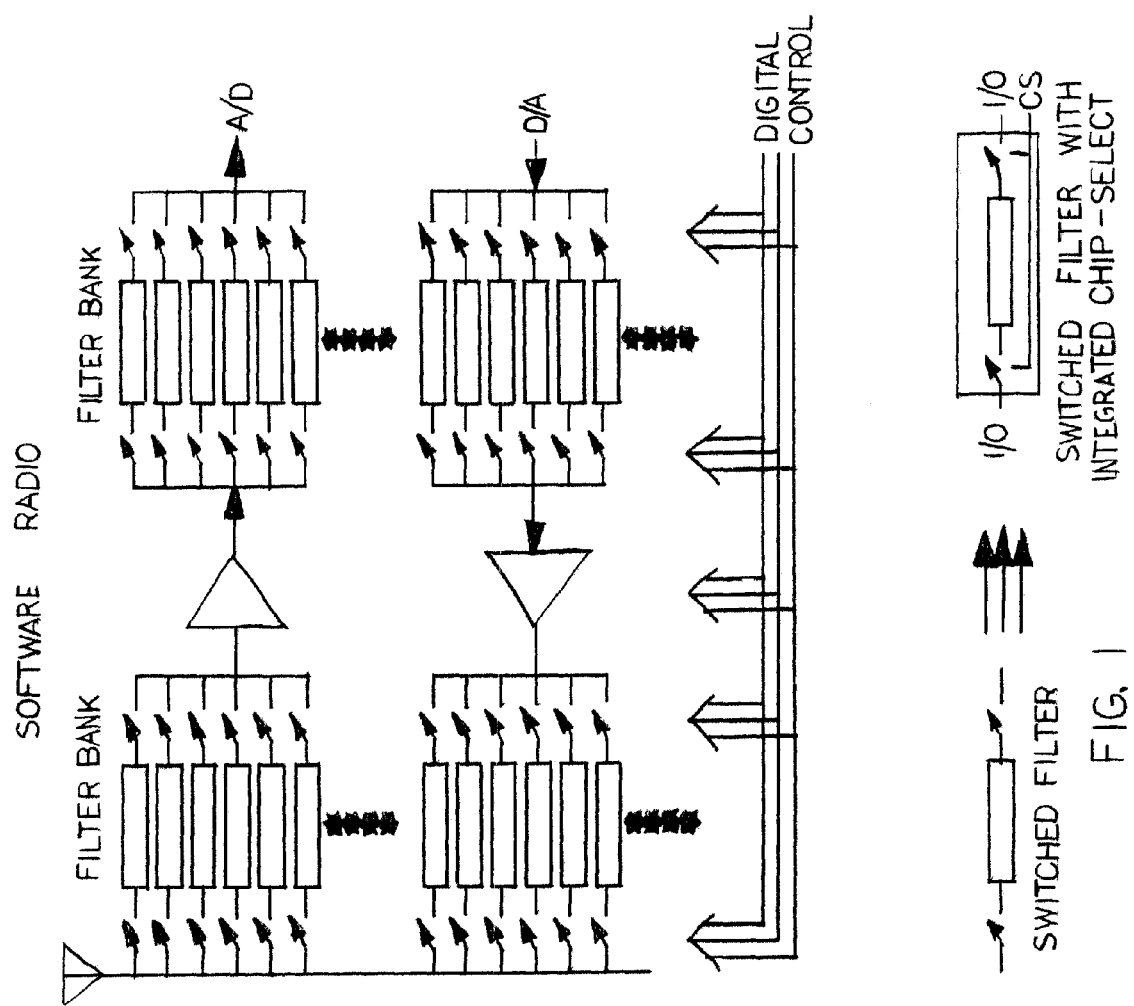
FIG. 1 is a schematic view of circuit module according to the present invention.

Integration between active components of semiconductors such as Silicon(Si), Silicon Germanium (SiGe), bipolar transistors, hetero-junction bipolar transistors (HBTs), and high electron mobility transistors(HEMTs), and Gallium Arsenide(GaAs) field effect transistors, with passive components such as high frequency filter elements, has been desired for sometime. This is because of the desire to have future appliances controlled by one control unit for home and personal electronic equipment at anytime and anyplace, while including for communication capabilities and receiving broadcasts. FIG. 1 shows a block schematic diagram of a circuit module including a filter bank with control switches and amplifiers for use in wireless mobile telecommunication equipment. Both the amplifiers and switches can be included as part of an active component semiconductor materials, such as Si, SiGe or GaAs, and the filter banks are made of dielectric materials. The active component semiconductor materials are used as signal processors which receive a frequency signal and respond to that signal with a desired action. It is desired to have the dielectric materials which are used for the high frequency filters be co-processed with the semiconductor materials to effectively integrated both into a monolithic module for wireless mobile telecommunication equipment. Integration of the dielectric and semiconductor materials into one functioning unit will increase efficiency, reduce manufacturing cost and reduce space require in electronic equipment, as compared to having separate components used today.

The present invention is a polymer bulk acoustic resonator manufactured to integrate the high frequency filters with the semiconductor materials for switches and amplifiers, as described above and shown in FIGS. 2-8. The polymer bulk acoustic resonator utilizes piezoelectric Electro-Active Polymers (EAP) as the thin film materials for manufacturing the polymer bulk acoustic resonator. The manufacture of the polymer bulk acoustic resonator employs a new approach in order to co-process active semiconductor materials such as Si, SiGe or GaAs with passive high frequency filter piezoelectric polymer materials of EAP. By using EAP materials for passive filter devices, one can readily and cost effectively produce integrated modules of a passive filter bank along with active switches and amplifiers for wireless mobile telecommunication network equipment. The operating frequency of the polymer bulk acoustic resonator depends primarily on the thickness, density and bulk modulus of the EAP materials, which can be in the range of about 100 MHz to 30 GHz. The sound velocity (v) for EAP materials ranges from fifteen-hundred (1500) to two-thousand (2000) meters per second. For a given resonant frequency $f_R$, there is the equation $f_R = v/(2*(\text{thickness of the EAP}))$. Therefore, the thickness of EAP films for 1 GHz, 3 GHz, and 10 GHz resonant frequencies are 0.75 um, 0.25 um, and 0.075 um, respectively. Usually, it is desired for the polymer bulk acoustic resonator to allow passage of the quarter wavelength resonate of the desired frequency or frequencies.

Photolithography methods and spin casting techniques are used for semiconductor fabrication and can be used to fabricate the polymer bulk acoustic resonator. Photolithography methods are used for cleaning the semiconductor to receive other layers. Spin casting is used to apply layers of other materials to the semiconductor. Metals such as Aluminum (Al), Gold (Au), Platinum (Pt) and conductive polymer materials such as poly-acetylene, polypyrrole, poly-aniline, polythiophene, and other high molecular polymers can all be used as electrode materials in a liquid phase for the manufacture of the polymer bulk acoustic resonator. Electrodes and piezoelectric polymer thin film layers formed on semiconductor substrates can be made by the spin casting the material on the semiconductor. The spin casted materials are then cured by solidifying thermally or by exposing the material to light energy sources of ultra-violet light. The photolithograph method can be used with masking techniques and organic cleaning during manufacture of the polymer bulk acoustic resonator to prepare the surface of the semiconductor and other layers to receive the next layer. The spin casting technique can be used to make both piezoelectric EAP layers and electrode layers during the manufacturing of the polymer bulk acoustic resonator. Note, that both EAP and electrode materials are available as liquid phases for use with spin casting techniques. By using the EAP as materials for the piezoelectric bulk acoustic resonator, the Bragg Reflector which is integrated in the film bulk acoustic resonator for use in the active semiconductor based switch and amplifier circuits can be eliminated for some devices and reduced in size for other devices. This is because the magnitudes of the acoustic impedance of the EAP material is not similar to the semiconductor substrate material. The evaporating of piezo-polymer and electrode layers by thermal or laser techniques can also be used to form the desired thin layers of EAP, which can be co-processed with the active control elements of switches and amplifiers on semiconductor substrates. The thickness of spin casting the EAP and electrodes layers can be controlled readily to provide the required uniformity at less cost than using the Magnetron method.

Figure 2:
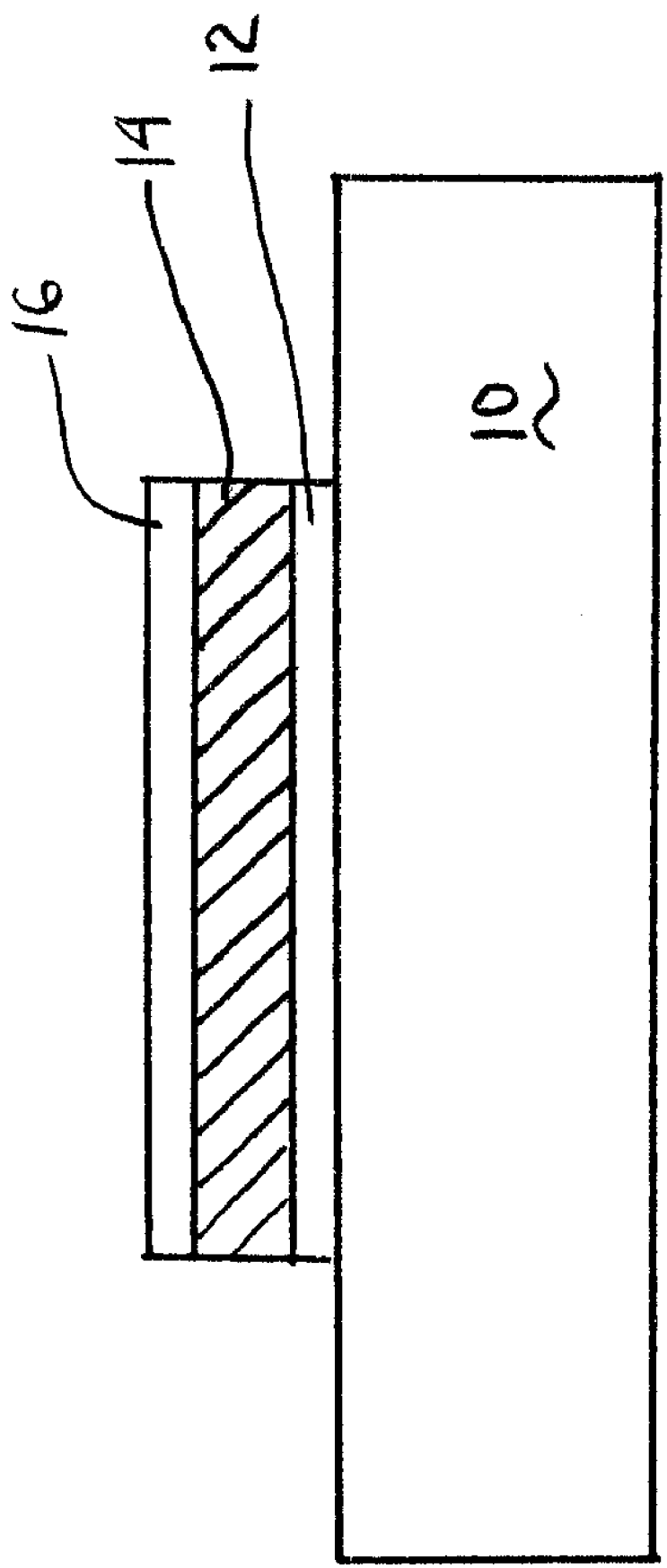
FIG. 2 is a schematic view of polymer bulk acoustic resonator according to the present invention.

FIGS. 2-8 schematically show on the processing steps of one method of manufacturing the polymer bulk acoustic resonator. FIG. 2 shows a schematic diagram of a polymer bulk acoustic resonator. FIG. 1 shows the semiconductor substrate layer 10 with a thin film bottom electrode layer 12 stacked on top of the semiconductor substrate layer. A thin film EAP layer 14 is stacked on top of the thin film bottom electrode layer 12. A thin film top electrode layer 16 is stacked on top of the thin film EAP layer 14. Note, there is no air gap or Bragg Reflector required to minimize the acoustic energy loss from the EAP layer to semiconductor substrate layer. This is possible because of the excellent acoustic impedance mismatch between the EAP layer and semiconductor substrate layer.

Figure 3:
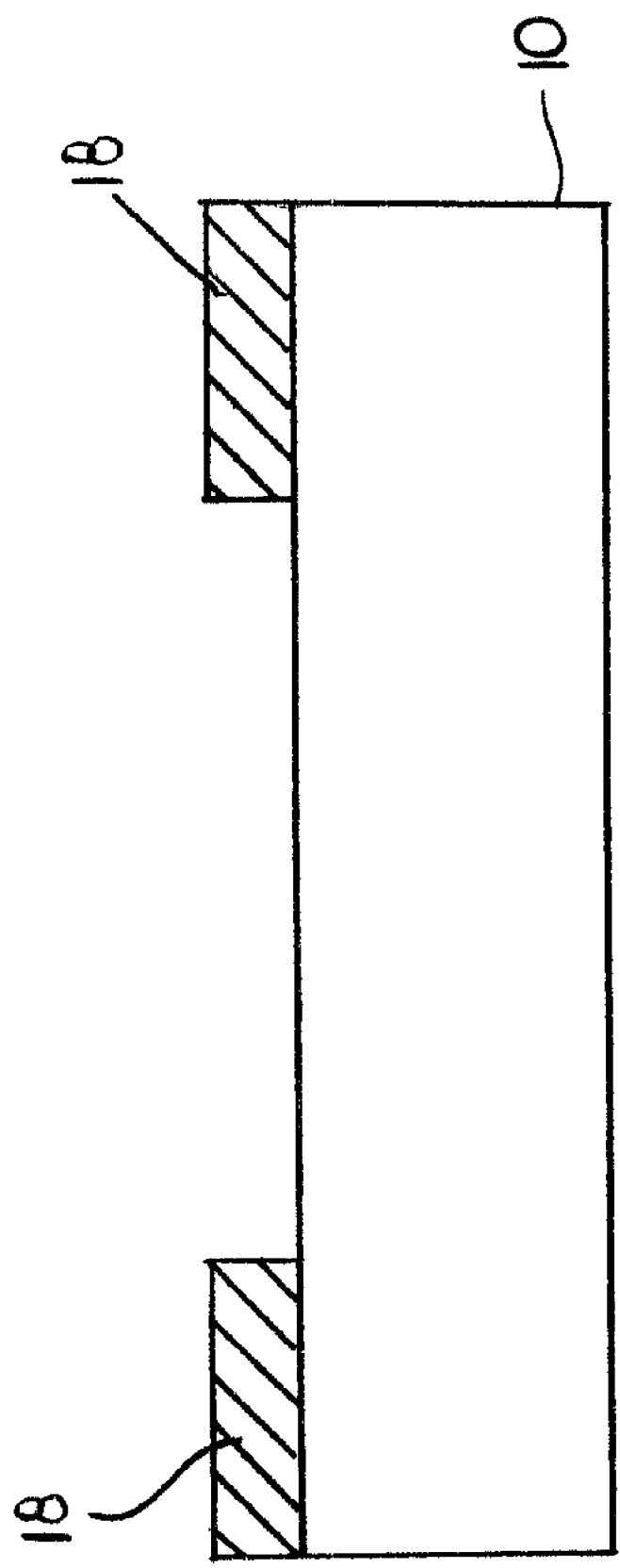
FIG. 3 is a schematic view of a step of making a polymer bulk acoustic resonator according to the present invention.
Figure 4:
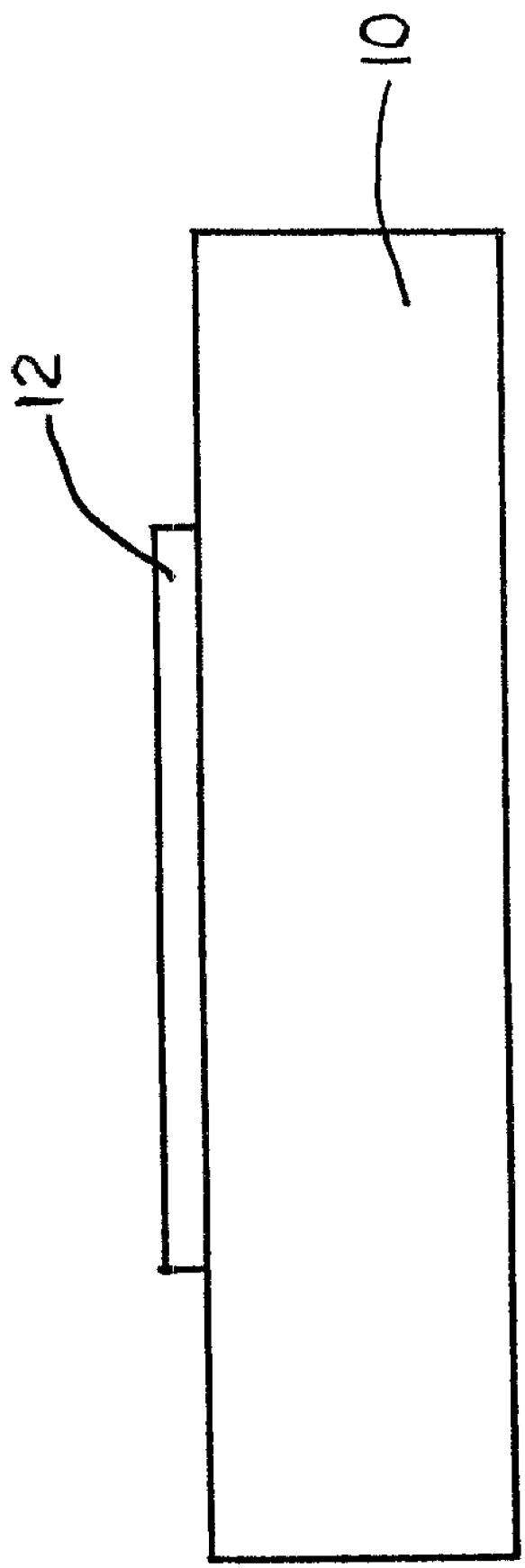
FIG. 4 is a schematic view of a step of making a polymer bulk acoustic resonator according to the present invention.
Figure 5:
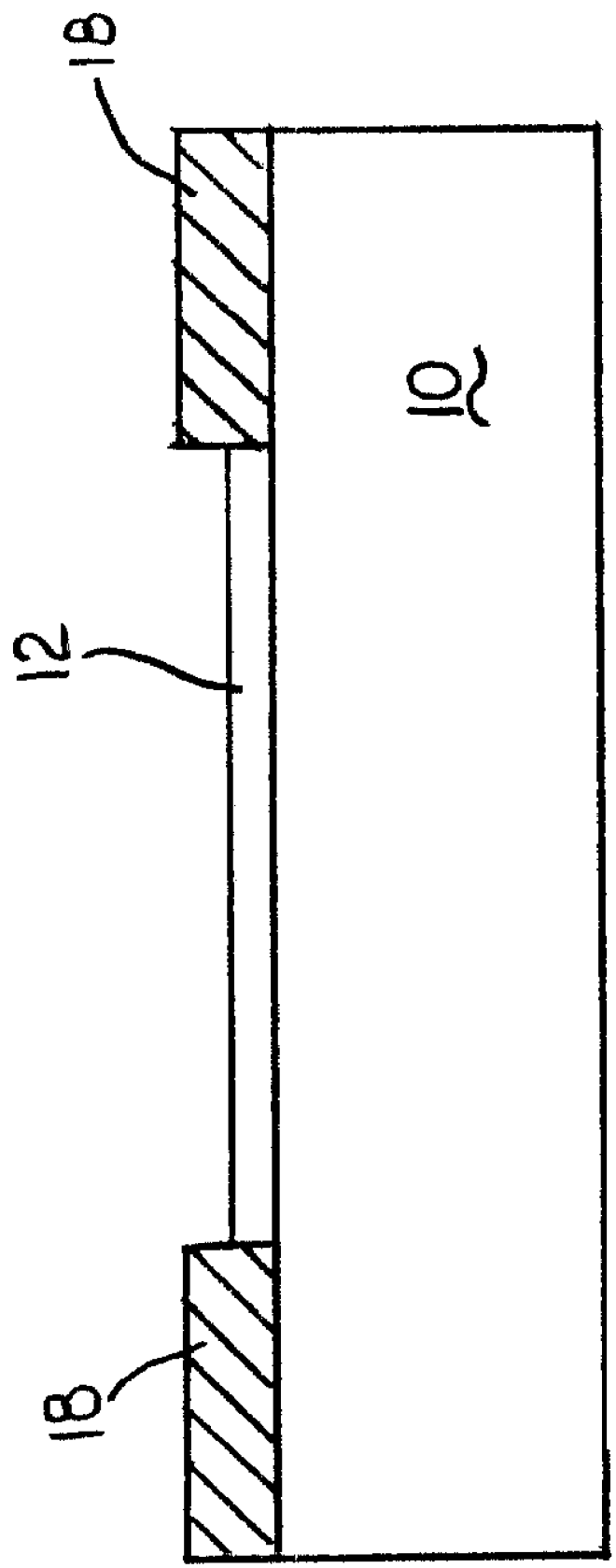
FIG. 5 is a schematic view of a step of making a polymer bulk acoustic resonator according to the present invention.
Figure 6:
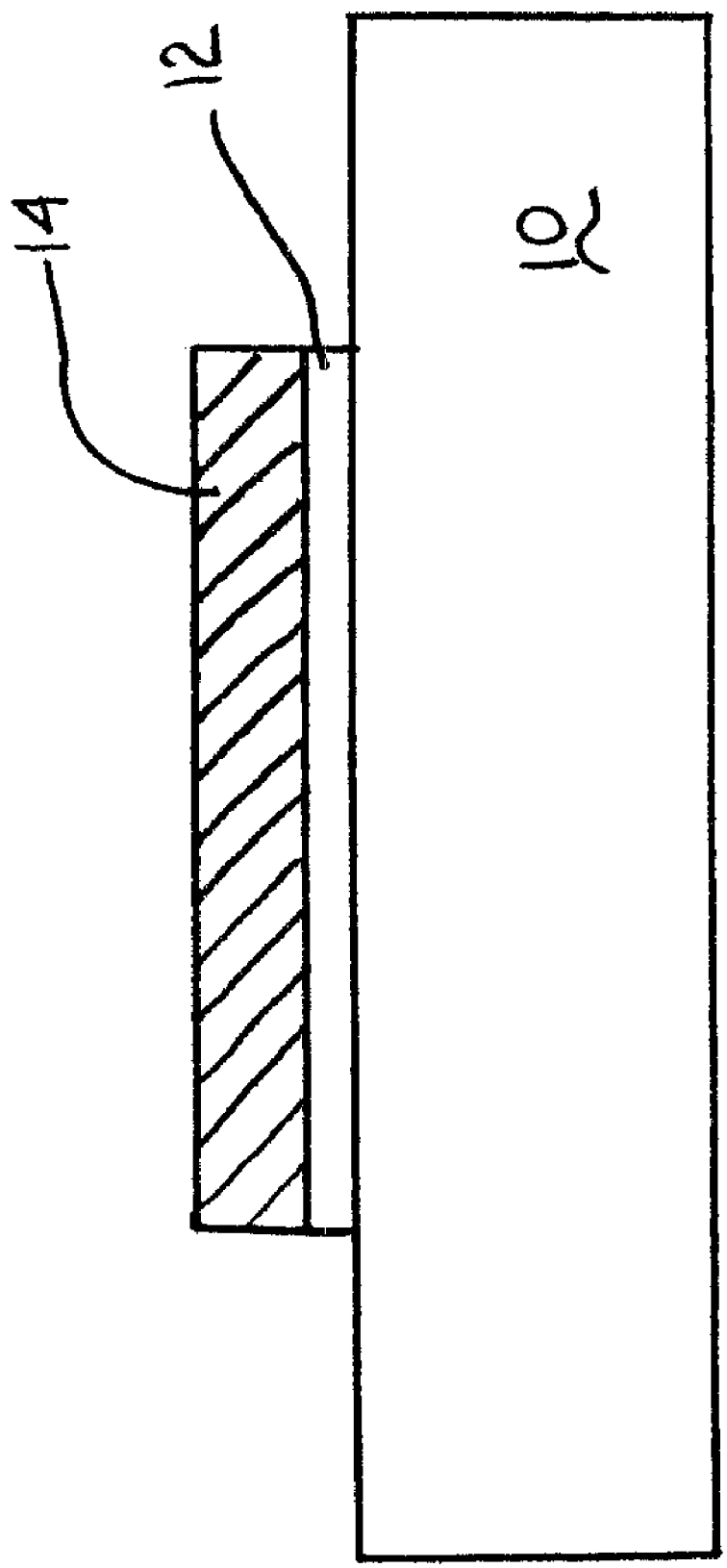
FIG. 6 is a schematic view of a step of making a polymer bulk acoustic resonator according to the present invention.
Figure 7:
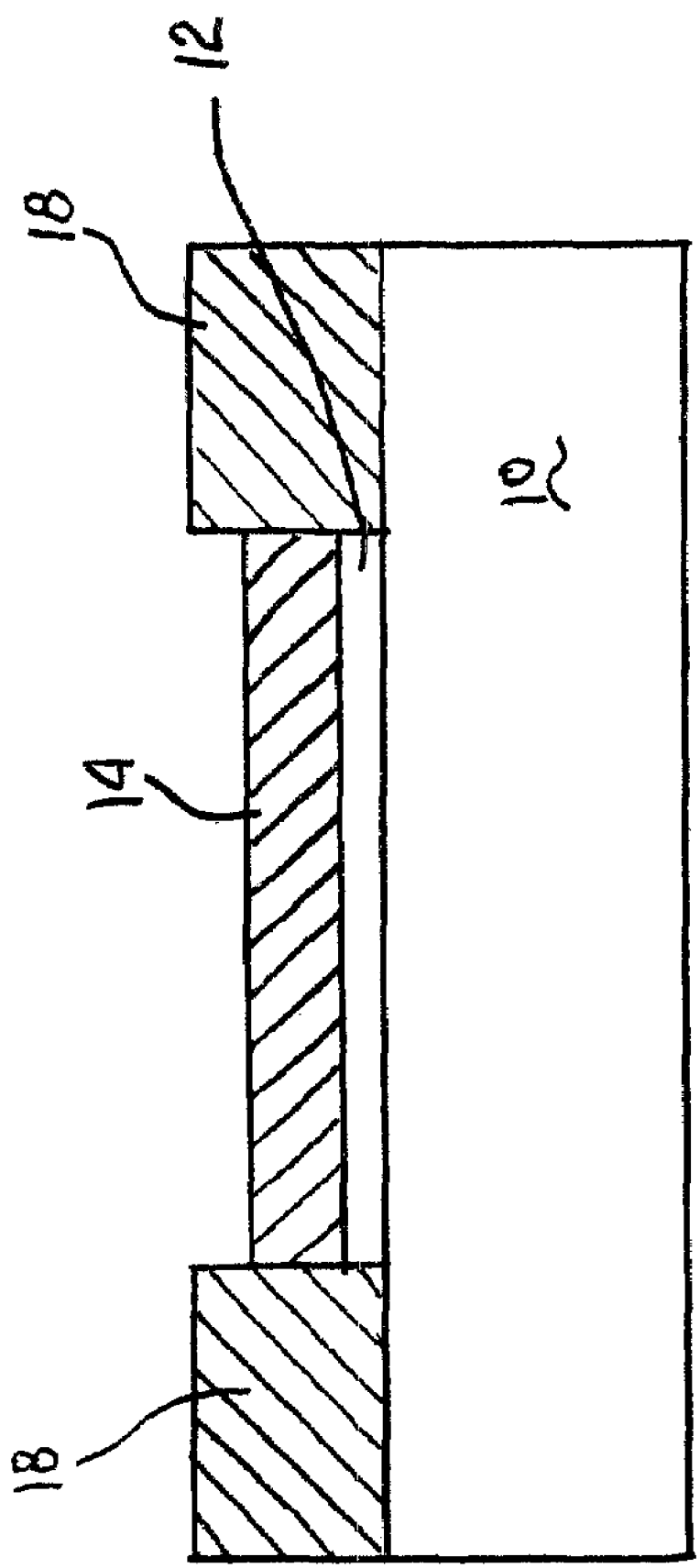
FIG. 7 is a schematic view of a step of making a polymer bulk acoustic resonator according to the present invention.
Figure 8:
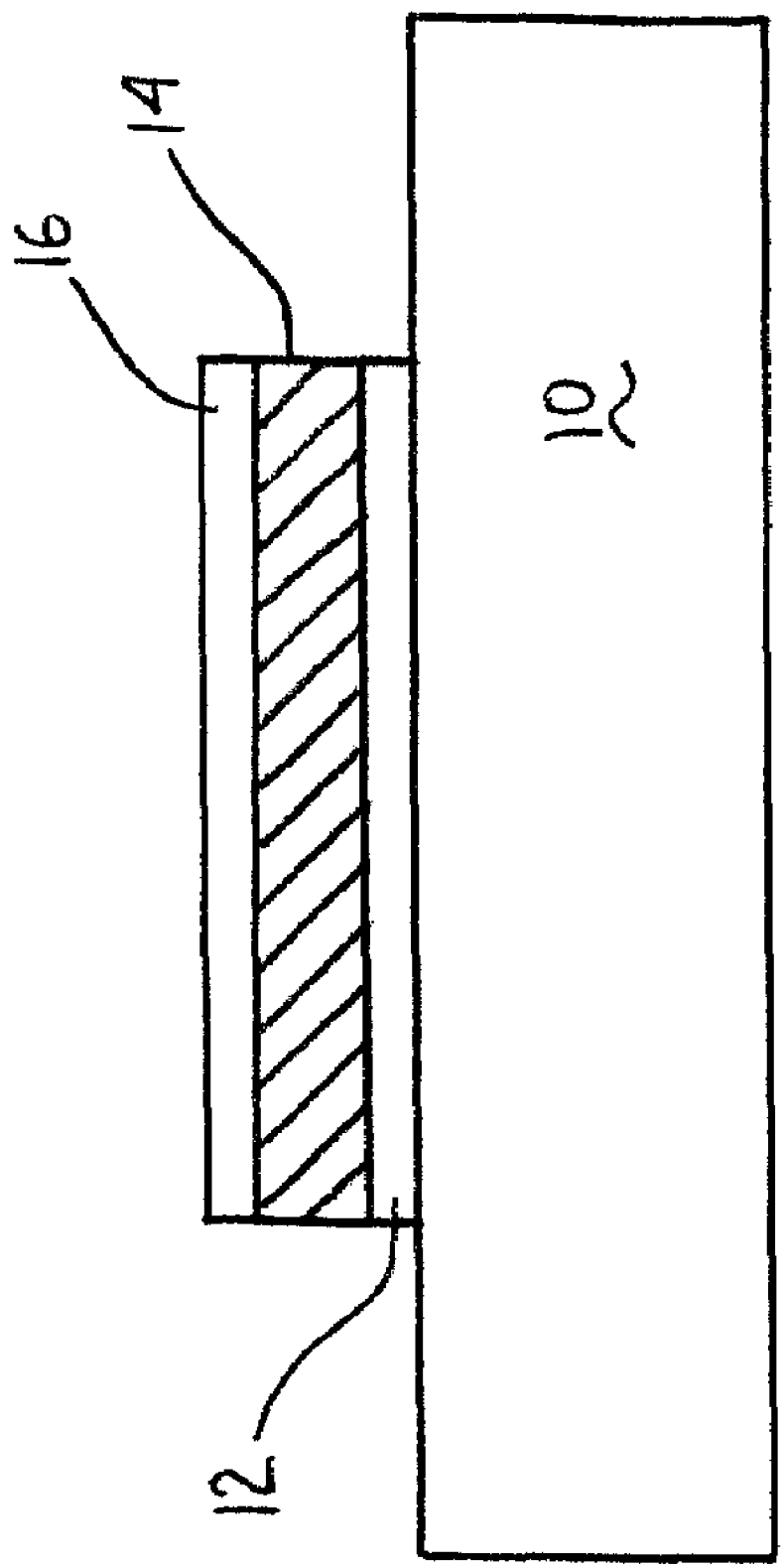
FIG. 8 is a schematic view of a step of making a polymer bulk acoustic resonator according to the present invention.

FIG. 3 shows a schematic diagram of masking the semiconductor substrate layer 10 for photolithograph and organic cleaning. FIG. 4 shows a schematic diagram of the bottom electrode layer 12 being laid down upon the semiconductor substrate layer 10. FIG. 5 shows a schematic diagram of masking the semiconductor substrate layer 10 again in preparation for cleaning and adding the EAP layer 14. FIG. 6 shows a schematic diagram of the EAP layer 14 being laid down on the bottom electrode layer 12. FIG. 7 shows a schematic diagram of masking the semiconductor substrate layer 10 again for cleaning and adding the top electrode layer 16. FIG. 8 shows a schematic diagram of the top electrode layer 16 being laid down on top of the EAP layer 14.

Polymer and oligomer materials can be integrated during the microelectronic fabrication process for producing the polymer bulk acoustic resonator, as was discussed above for polymers. In chemistry, there are three terms that are related to polymers. The first is the term monomer, which is the smallest functional unit. The second term is oligomer, which is the combination of several monomers. The third term is polymers, which is many monomers. Moreover, polymer and oligomer materials have a low acoustic impedance in the range of 2 to 3 Mrayls, which can improve the acoustic isolation of a resonator from the semiconductor substrate layer 10 of the polymer bulk acoustic resonator and simplify the fabrication process and cost. The following are examples and methods of manufacture of the polymer bulk acoustic resonator using polymer and oligomer materials.

A first example is polyureas piezoelectric films for making the polymer bulk acoustic resonator. Aromatic polyureas piezoelectric films can be formed by evaporating a stoichiometrically balanced sample of P(MDA/MDI), (MDA: 4,4'-diaminodiphenylmethane; MDI: 4,4'-diphenylmethane) with the evaporation temperatures of MDA and MDI held at 100 and 70° C., respectively, on the bottom electrode layer 12 which is at room temperature. Annealing at 200° C. leads to polymerization of the deposited aromatic polyurea piezoelectric films. These aromatic polyureas piezoelectric films should be further poled to impart piezoelectric activity. The poling field should be above 100 MV/m at a temperature of 200° C. The composition ratio of MDA/MDI can be varied by using different evaporation temperatures to adjust the respective evaporating rate of MDA and MDI. In addition to polyurea films of P(MDA/MDI), other compositions such as P(MeMDA/MDI), P(ODA/MDI), and P(SDA/MDI) can also be made into thin films deposited on the bottom electrode layer 12. Wherein, MeMDA is 4,4'-diamino diphenylmethane; ODA is 4,4'-diamino diphenyl ether; and SDA is 4,4'-diamino diphenyl thioether. All these films show a temperature independence dielectric constant of about 4 with dielectric loss much less than 1%, which is on par with ZnO and $Al_4N_3$, that are used for prior art ceramic resonators. These films also exhibit high piezoelectric response, $e_{31}$~20 $mC/m^2$, for P(ODA/MDI), $e_{31}$ is higher than 25 $mC/m^2$. As for all the piezoelectric materials, $e_{33}$ of the polyureas is higher ($|e_{33}|>|e_{31}|$). The easy processing into thin films on the bottom electrode layer 12, flat temperature dependence of the piezoelectric and dielectric responses, and very low dielectric loss indicate that the piezoelectric polyureas thin films are an excellent piezoelectric polymer thin film for use in the manufacture of the polymer bulk acoustic resonator. In addition, N-phenylated polyurea, which can be obtained by reaction of equimolar mixture of α,-α-dianilino-p-xylene with 4,4'-diphenylmelthane can be used. N-phenylated polyurea can be processed to free-standing films easily and exhibit piezoelectric activity after poling. Also, Polyurea-9, $[(CH_2)_9—NH—CO—NH—]_n$, is another piezoelectric polymer which can be used for the polymer bulk acoustic resonator.

Another example of a material that can be used is Vinylidene fluoride and similar piezoelectric oligomer films and polymer films for making the polymer bulk acoustic resonator. Polyvinylidene fluoride (PVDF), the copolymer of VDF with trifluoroethylene (TrFE) (PVDF-TrFE)), with tetrafluoroethylene (PVDF-TFE)), with hexfluoroethylene (PVDF-HFP)), and chlorotrifluoroethylene (PVDF-CTFE), exhibit various degree of piezoelectric activities. These polymers have also been shown to exhibit very high electromechanical responses for small devices (>10 GHz). Thin films of these polymers can be prepared using spin cast technique in a thickness ranging from a few molecular layers or nanometers to films thicker than 1 μm. In bulk samples of PVDF, PVDF-TrFE, and PVDF-TFE, it has been observed that these polymers exhibit large dielectric loss (>10%) at the GHz frequency range. This may be detrimental for use as a material for the polymer bulk acoustic resonator, as it could reduce the resonator quality factor and efficiency. Although in ultrathin films (thickness below 0.1 µm), the chain segment motions will be affected by the interfaces which may reduce this loss, it is an advantage to use piezoelectric thin films without such a loss. In PVDF and its copolymers, the origin of the GHz dielectric loss is due to the long range chain segment motion (beta-relaxation process) in these polymers. By working with oligomer films rather than the polymer films of these materials, the beta relaxation process in PVDF and related copolymers can be eliminated.

The thin films of the oligomer VDF, or VDF-TrFE, VDF-TFE, VDF-HFP, VDF-CTFE, etc. piezoelectric films can be prepared by thermal evaporation method in which these oligomers are placed in a crucible and heated to above room temperature (preferably above 250° C.) and the bottom electrode layer 12 is held at a temperature near room temperature or below (0° C. or below). Low bottom electrode layer 12 temperature can prevent any re-evaporation of the arrived oligomer material. The films deposited on the bottom electrode layer 12 are poled to align the dipoles so that to establish high piezoelectric activities. The poling field should be above 40 MV/m at room temperature or above room temperature. The poling can also be done by employing well known non-contact methods such as corona poling. The oligomer films may also be deposited on the bottom electrode layer 12 using spin cast technique.

To improve the acoustic isolation of the piezoelectric polymer films from the semiconductor substrate layer 10, a heavy metal film of high acoustic impedance of ¼ wavelength thickness such as Tungsten (W) can be deposited as the bottom electrode layer 12 on the semiconductor substrate layer 10 before the deposition of the piezoelectric polymer films. The energy reflection at the interface of the polymer thin film and the semiconductor substrate layer 10 can be estimated from $\Gamma^2=(Z_{02}-Z_{01})^2/(Z_{02}+Z_{01})^2$ where $Z_{01}$ and $Z_{02}$ are the specific acoustic impedance of the semiconductor substrate layer 10 and the polymer film, respectively. The acoustic impedance of the polymer resonator is in the range between 2 MRayls to 3 MRayls and the bottom electrode layer 12 is on the order of 60 MRayls. Therefore the acoustic energy loss $1-\Gamma^2$ is about 15% or 0.15, which is much smaller than that of the prior art ceramic resonators.

For the case of a metal film layer (acoustic impedance $Z_0$ and layer thickness l) formed between the polymer resonator (acoustic impedance $Z_{01}$) and the semiconductor substrate layer 10 (acoustic impedance $Z_{02}$), the reflection coefficient $\Gamma$ is $\Gamma=(Z_{in}-Z_{01})/(Z_{in}+Z_{01})$, where $Z_{in}$ is the effective specific acoustic impedance of the metal film layer plus the semiconductor substrate layer 10, $$Z_{in} = \frac{Z_{02}\cos\beta l + jZ_0\sin\beta l}{Z_0\cos\beta l + jZ_{02}\sin\beta l}$$

Therefore $Z_{in}$ will change with thickness of the metal film layer thickness l. For l=¼ wavelength, $Z_{in}=Z_0^2/Z_{02}$. For the $SiO_2$ as the semiconductor substrate layer 10, $Z_{02}=13$ Mrayls and using Au as the bottom electrode layer 12, $Z_0=62$ Mrayls, so that $Z_{in}$ is 295.7 MRayls. Consequently, the energy loss is reduced to 3.3% (0.033). If a W (¼ wavelength) layer is used as a metal film layer, the energy loss can be reduced to 1.15% (0.0115)

Figure 9:
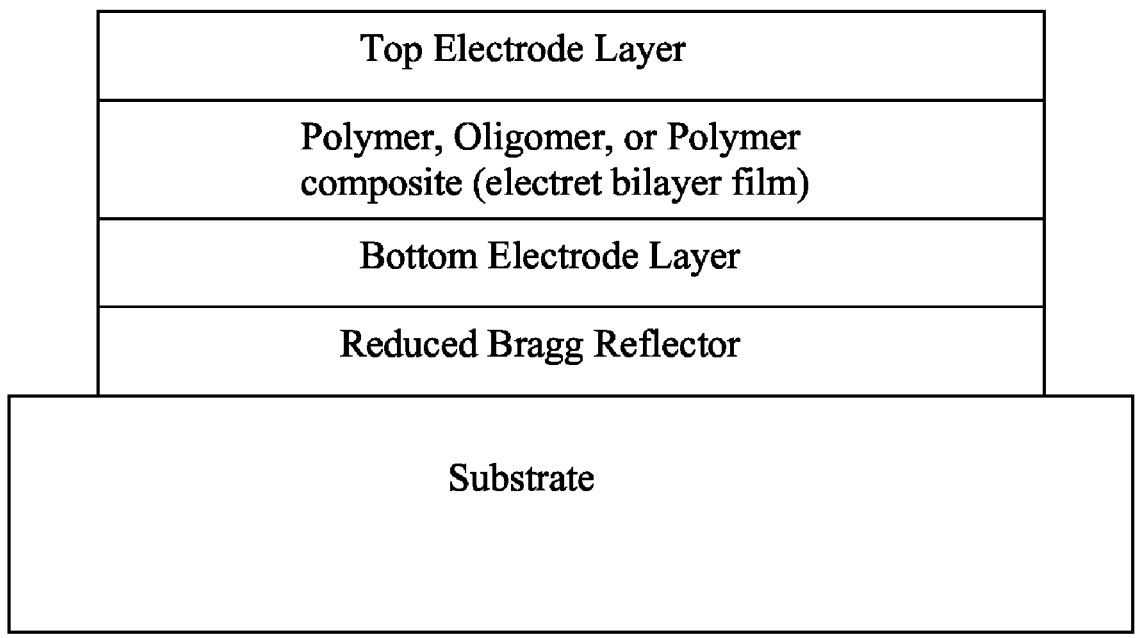
FIG. 9 is a schematic view of a step a polymer bulk acoustic resonator with a reduced Bragg reflector according to the present invention.

To realize a high quality factor of reduced acoustic energy loss, a multilayer acoustic reduced Bragg reflector can be deposited on the semiconductor substrate layer 10 before the deposition of the piezoelectric polymer films, as shown in FIG. 9. The reduced Bragg reflector can be made in a multilayer form of an ABABAB sequence, where A can be a metal film layer such as Au or Al and B can be a polymer layer such as PMMA, poly(methyl methacrylate), or other polymers, with each layer thickness of the reduced Bragg reflector at ¼ wavelength. The multilayer form of an ABABAB sequence can be as simple as a one AB multiplayer for the reduced Bragg reflector. The large contrast in the acoustic impedance in the reduced Bragg reflector between the metal film layer and polymer layers significantly reduces the number of layers required to achieve high acoustic isolation, as compared to the used of the prior art Bragg reflector used along with the prior art film bulk acoustic resonator. For example, with only 4 layers, of Au and PMMA alternately sequenced as a reduced Bragg reflector, the energy loss is less than 0.001, which corresponds to a Quality factor (Q) of higher than 1000. Whereby, Q is defined by Q=1/Loss. If Al is used instead of Au, the reduced Bragg reflector requires just 6 layers of the Al alternately sequence with PMMA to obtain an energy loss less than 0.001. Use of a heavy metal such as Tungsten (W) as the thin film bottom electrode layer 12 can also be the first layer of the reduced Bragg reflector, which further reduces the number of layers required for the reduced Bragg reflector.

Another example is the use of polymer electret thin films with designed heterogeneity. Polymer electret films can be formed by charging special polymer films that have the characteristic of a long charge trapping time can be used in the manufacture of the polymer bulk acoustic resonator. The polymer electret films that can be used include PTFE, Teflon AF (from DuPont), polypropylene (PP), and other polymers with charge trapping time longer than about one day. Some of these polymers such as PTFE and Teflon AF possess very low loss due to their high glass transition temperature (>100° C.). For a heterogeneous polymer electret film, for example, a bilayer film with each layer having different elastic modulus, $Y_1$ and $Y_2$, respectively, it can be shown that a thickness piezoelectric response $d_{33}$ can be induced, $$d_{33} = \sigma \frac{\varepsilon_1 \varepsilon_2 t_1 t_2}{(\varepsilon_2 t_1 + \varepsilon_1 t_2)} \left(\frac{1}{Y_1} - \frac{1}{Y_2}\right).$$

Where, $\varepsilon_i$, $t_i$ are the dielectric constant and thickness of the i-th layer (i=1 and 2). Therefore, by using a bilayer film with one layer possessing a very low elastic modulus, a high piezoelectric response can be achieved. One example is having one layer of the bilayer film being a nanoporpous polymer film and the other layer of bilayer film being a regular polymer film. Both layers can be from PTFE, Teflon AF, and similar polymers. Using the technique developed recently to form nano-porous polymers, one layer, can be first span cast on the semiconductor substrate layer 10 and fabricated to a nano-porous film. The pore size can be controlled to below 5 nm, if needed, and the porosity of the film can be between 10% to 90% depending on the requirement of the device to be manufactured. Different porosity will yield a different elastic modulus. Afterwards, another polymer layer is spin cast on the porous film to form the bilayer film. The bilayer film is then charged using a method such as corona charge to induce a surface charge with charge density σ. By using different thickness ratio between the two layers and different elastic modulus, the resonator piezoelectric response and resonance frequency can be varied. For the polymer bulk acoustic resonator made using this type of bilayer composite electret film there is a very low acoustic impedance. When the nanoporosity can be higher than 90%, the effective acoustic impedance can be less than 0.03 MRayls. Using a ¼ wavelength thick Au electrode on a semiconductor substrate 10, the energy loss will be smaller than 0.05% (0.0005 or a Q of 2000). For such a polymer bulk acoustic resonator using a bilayer composite electret film, there is no need for the use of the Bragg reflector.

While different embodiments of the invention have been described in detail herein, it will be appreciated by those skilled in the art that various modifications and alternatives to the embodiments could be developed in light of the overall teachings of the disclosure. Accordingly, the particular arrangements are illustrative only and are not limiting as to the scope of the invention that is to be given the full breadth of any and all equivalents thereof.

We claim:

1. A polymer bulk acoustic resonator comprising:
an active semiconductor layer;
a first thin film electrode layer applied to said semiconductor layer;
a thin film electro-active polymer layer applied to said first thin film electrode layer;
a second thin film electrode layer applied to said thin film electro-active polymer layer; and
said thin film electro-active polymer layer is a polymer electret film.

2. A polymer bulk acoustic resonator comprising:
an active semiconductor layer;
a first thin film electrode layer applied to said semiconductor layer;
a thin film electro-active polymer layer applied to said first thin film electrode layer;
a second thin film electrode layer applied to said thin film electro-active polymer layer; and
a Bragg Reflector applied between said first thin film electrode layer and said thin film electro-active polymer layer.

3. A polymer bulk acoustic resonator comprising:
an active semiconductor layer;
a first thin film electrode layer applied to said semiconductor layer;
a thin film electro-active polymer layer applied to said first thin film electrode layer;
a second thin film electrode layer applied to said thin film electro-active polymer layer; and
a reduced Bragg Reflector applied between said first thin film electrode layer and said thin film electro-active polymer layer.

4. A polymer bulk acoustic resonator comprising:
an active semiconductor layer;
a first thin film electrode layer applied to said semiconductor layer;
a thin film electro-active polymer layer applied to said first thin film electrode layer;
a second thin film electrode layer applied to said thin film electro-active polymer layer; and
said thin film electro-active polymer layer is a polyurea piezoelectric film.

5. The polymer bulk acoustic resonator of claim 3, wherein in said thin film electro-active polymer layer is a polyurea piezoelectric film.

6. A polymer bulk acoustic resonator comprising:
an active semiconductor layer;
a first thin film electrode layer applied to said semiconductor layer;
a thin film electro-active polymer layer applied to said first thin film electrode layer;
a second thin film electrode layer applied to said thin film electro-active polymer layer; and
said thin film electro-active polymer layer is a piezoelectric oligomer film.

7. The polymer bulk acoustic resonator of claim 3, wherein in said thin film electro-active polymer layer is a piezoelectric oligomer film.

8. The polymer bulk acoustic resonator of claim 3, wherein said first thin film electrode layer applied to said semiconductor layer is a heavy metal film of high acoustic impendence and also is the first layer of said reduced Bragg Reflector.

9. A polymer bulk acoustic resonator comprising:
an active semiconductor layer;
a first thin film electrode layer applied to said semiconductor layer;
a thin film electro-active polymer layer applied to said first thin film electrode layer;
a second thin film electrode layer applied to said thin film electro-active polymer layer; and
said first thin film electrode layer applied to said semiconductor layer is a heavy metal film of high acoustic impendence to improve acoustic isolation of said thin film electro-active polymer layer applied to said first thin film electrode layer.

10. The polymer bulk acoustic resonator of claim 3, wherein said semiconductor layer includes at least one switch and said electro-active polymer layer is a frequency signal filter.

11. The polymer bulk acoustic resonator of claim 3, wherein said semiconductor layer includes at least one amplifier and said electro-active polymer layer is a frequency signal filter.

12. The polymer bulk acoustic resonator of claim 3, wherein said semiconductor layer includes at least one signal processor and said electro-active polymer layer is a frequency signal filter.

* * * * *